US011699778B2

(12) United States Patent
Saitoh et al.

(10) Patent No.: US 11,699,778 B2
(45) Date of Patent: Jul. 11, 2023

(54) DISPLAY DEVICE WITH A CONTROLLED THICKNESS

(71) Applicant: SHARP KABUSHIKI KAISHA, Sakai (JP)

(72) Inventors: Takao Saitoh, Sakai (JP); Yi Sun, Sakai (JP); Yohsuke Kanzaki, Sakai (JP); Masaki Yamanaka, Sakai (JP); Masahiko Miwa, Sakai (JP); Seiji Kaneko, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 199 days.

(21) Appl. No.: 16/981,463

(22) PCT Filed: Mar. 16, 2018

(86) PCT No.: PCT/JP2018/010621
§ 371 (c)(1),
(2) Date: Sep. 16, 2020

(87) PCT Pub. No.: WO2019/176113
PCT Pub. Date: Sep. 19, 2019

(65) Prior Publication Data
US 2021/0028336 A1    Jan. 28, 2021

(51) Int. Cl.
*H01L 33/56* (2010.01)
*H01L 33/00* (2010.01)

(52) U.S. Cl.
CPC .......... *H01L 33/56* (2013.01); *H01L 33/0095* (2013.01); *H01L 2933/005* (2013.01)

(58) Field of Classification Search
CPC ................ H01L 33/56; H01L 2933/005
See application file for complete search history.

(56) References Cited

U.S. PATENT DOCUMENTS

| | | | |
|---|---|---|---|
| 2008/0018229 A1 | 1/2008 | Yamazaki | |
| 2010/0165255 A1* | 7/2010 | Ishitani | H01L 27/1225 438/30 |
| 2013/0049003 A1 | 2/2013 | Choi et al. | |
| 2015/0041772 A1* | 2/2015 | Han | H01L 51/525 438/23 |
| 2015/0185539 A1 | 7/2015 | Senokuchi et al. | |
| 2016/0351539 A1* | 12/2016 | Bower | H01L 33/44 |
| 2020/0243782 A1* | 7/2020 | Maruyama | H01L 51/56 |

FOREIGN PATENT DOCUMENTS

| | | |
|---|---|---|
| JP | 2006-126817 A | 5/2006 |
| WO | 2014/024455 A1 | 2/2014 |

* cited by examiner

*Primary Examiner* — Jay C Chang
*Assistant Examiner* — Mikka Liu
(74) *Attorney, Agent, or Firm* — ScienBiziP, P.C.

(57) ABSTRACT

A display device includes: an underlayer, a first insulating film contacting an upper face of the underlayer, a semiconductor layer, a second insulating film, a first metal layer, a first resin layer, a first electrode, and a second resin layer, in order from a lower layer, wherein at least one of the underlayer, the first resin layer, and the second resin layer is a thin film layer having a maximum film thickness in a display region provided with a light-emitting element being thicker than a maximum film thickness in a frame region surrounding the display region.

13 Claims, 7 Drawing Sheets

US 11,699,778 B2

DISPLAY DEVICE WITH A CONTROLLED THICKNESS

TECHNICAL FIELD

The disclosure relates to a display device provided with a light-emitting element.

BACKGROUND ART

PTL 1 discloses a display panel in which spacers are formed in backplanes. The spacers are used for height control of a lower substrate and a counter substrate, or as photo spacers that make contact with a mask for vapor deposition used for each layer formation of the display device.

CITATION LIST

Patent Literature

PTL 1: WO2014-024455, published on Feb. 13, 2014

SUMMARY

Technical Problem

In order to form a dummy pattern, a short ring, a gate driver, or the like in the frame region, a pattern of each layer in the display region provided with the light-emitting element may also be formed in the frame region. At this time, in a case that each layer including a metal layer is layered in the frame region, it is conceivable that the height of a spacer in the display region is greater than the height of the layered body in the frame region. In such a case, it may be difficult to ensure the height of the spacer in the display region.

Solution to Problem

In order to solve the problem described above, a display device according to the present application includes: an underlayer, a first insulating film contacting an upper face of the underlayer, a semiconductor layer, a second insulating film, a first metal layer, a first resin layer, a first electrode, and a second resin layer, in order from a lower layer, wherein at least one of the underlayer, the first resin layer, and the second resin layer is a thin film layer having a maximum film thickness in a display region provided with a light-emitting element being thicker than a maximum film thickness in a frame region surrounding the display region.

In order to solve the problem described above, a method for manufacturing a display device according to the present application includes the step of: film-forming each layer of a display device including an underlayer, a first insulating film contacting an upper face of the underlayer, a semiconductor layer, a second insulating film, a first metal layer, a first resin layer, a first electrode, and a second resin layer, in order from a lower layer, wherein in the step of film-forming, a formation of at least one of the underlayer, the first resin layer, and the second resin layer includes a step of thinning to make a maximum film thickness in a display region provided with a light-emitting element being thicker than a maximum film thickness in a frame region surrounding the display region.

In order to solve the problem described above, a manufacturing apparatus of a display device according to the present application is configured to: form each layer of a display device including an underlayer, a first insulating film contacting an upper face of the underlayer, a semiconductor layer, a second insulating film, a first metal layer, a first resin layer, a first electrode, and a second resin layer, in order from a lower layer; and include a film formation apparatus that, in a formation of at least one of the underlayer, the first resin layer, and the second resin layer, make a maximum film thickness in a display region provided with a light-emitting element being thicker than a maximum film thickness in a frame region surrounding the display region.

Advantageous Effects Disclosure

According to the configurations described above, it is possible to appropriately control the film thickness of the layered body in the frame region, and it is possible to reduce the height of the layered body in the frame region from being higher than a structure in which height needs to be ensured, such as a spacer in the display region.

DESCRIPTION OF EMBODIMENTS

First Embodiment

In the following, the "same layer" means being formed of the same material in the same process. A "lower layer" refers to a layer formed in a process before a layer being compared, and an "upper layer" refers to a layer formed in a process after a layer being compared. In the present specification, a direction from a glass substrate 4 of a display device 2 toward a sealing layer 16 is referred to as upward.

Figure 1:
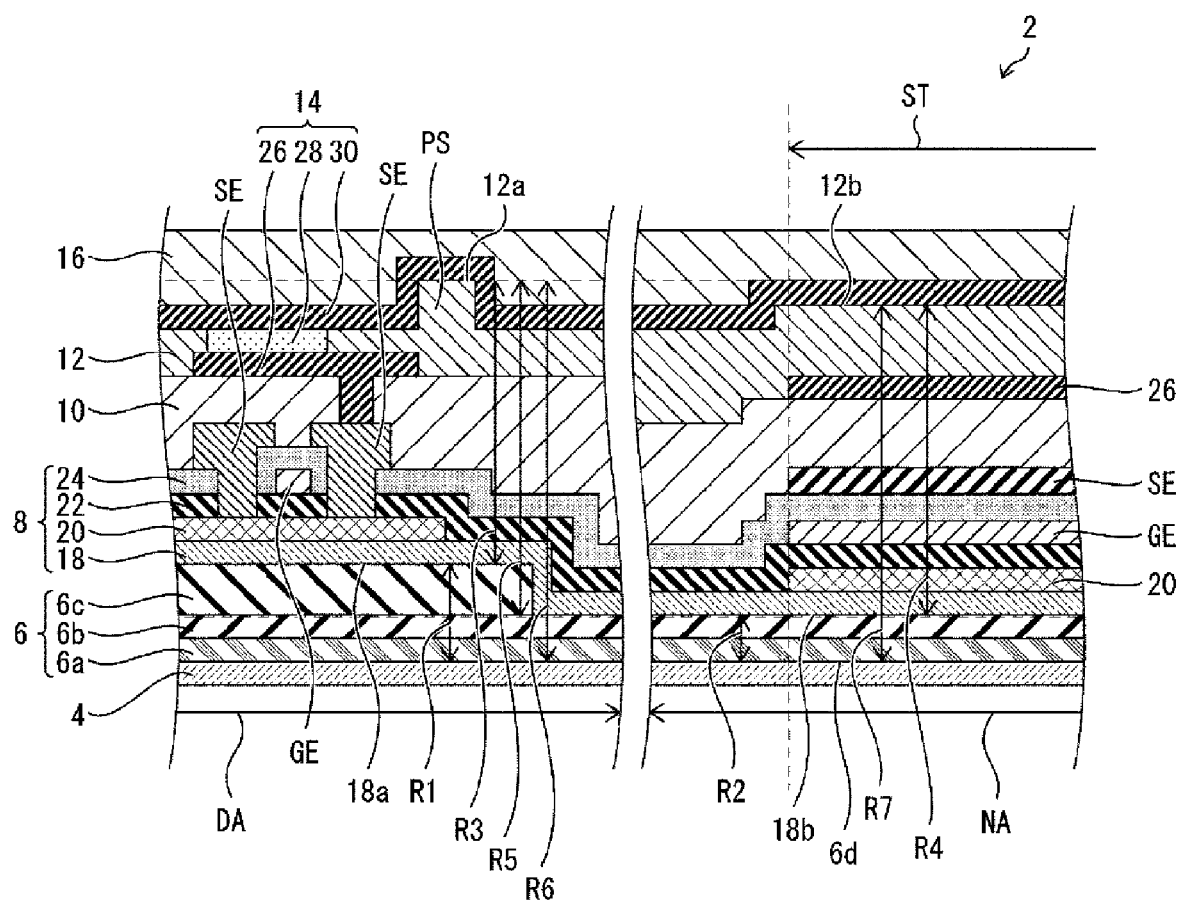
FIG. 1 is a schematic diagram of a side cross section of a display device according to a first embodiment.
Figure 2:
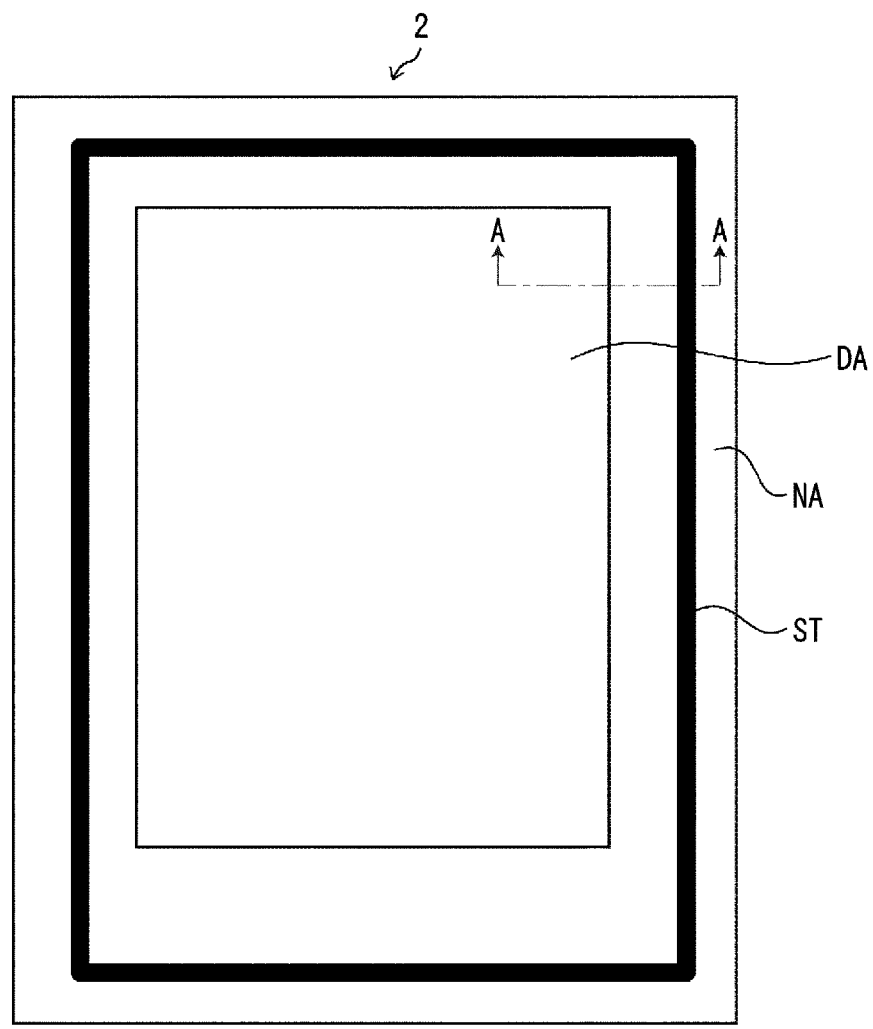
FIG. 2 is a schematic diagram in which the display device is viewed from an upper face according to the first embodiment.

FIG. 2 is a schematic diagram in which the display device 2 is viewed from the upper face according to the present embodiment. The display device 2 includes a display region DA including a light-emitting element and a frame region NA surrounding the display region. A schematic diagram of a side cross section of the display device 2 at a position across a boundary between the display region DA and the frame region NA is illustrated in FIG. 1. FIG. 1 is a cross-sectional view taken along the line A-A in FIG. 2.

As illustrated in FIG. 1, the display device 2 includes, in order from the glass substrate 4 toward the upper layer, an underlayer 6, a TFT layer 8, a first resin layer 10, a second resin layer 12, a light-emitting element layer 14, and a sealing layer 16. Each layer of the display device 2 may be formed by layering, in order from the lower layer, onto the glass substrate 4.

The underlayer 6 has a structure in which a lower layer resin layer 6a, an inorganic layer 6b, and an upper layer resin layer 6c are layered in this order. In the present embodiment, the lower layer resin layer 6a and the inorganic layer 6b are formed with substantially the same film thickness on the entire surface including the display region DA and the frame region NA of the display device 2. Furthermore, the upper layer resin layer 6c is formed only in the display region DA, and is not formed in the frame region NA.

In other words, the underlayer 6 includes the upper layer resin layer 6c only in the display region DA. Therefore, the maximum film thickness R1 of the underlayer 6 in the display region DA is greater than the maximum film thickness R2 of the underlayer 6 in the frame region NA. Therefore, the underlayer 6 is a thin film layer that is thinned in the frame region NA. The underlayer 6 may be obtained by forming the lower layer resin layer 6a, the inorganic layer 6b, and the upper layer resin layer 6c on the glass substrate 4 in this order, and removing only the upper layer resin layer 6c in the frame region NA by photolithography or the like. Note that, as illustrated in FIG. 1, the upper layer resin layer 6c may be removed even in a portion of the display region DA.

The TFT layer 8 has a structure in which a first insulating film 18, a semiconductor layer 20, a second insulating film 22, a first metal layer GE, a third insulating film 24, and a second metal layer SE are layered in this order on the underlayer 6. In the TFT layer 8, the first insulating film 18, the semiconductor layer 20, the second insulating film 22, the first metal layer GE, and the third insulating film 24 are formed not only in the display region DA but also in a portion of the frame region NA.

The first insulating film 18 is formed on the upper face of the upper layer resin layer 6c and the inorganic layer 6b. Therefore, the lower faces 18a and 18b of the first insulating film 18 contact the upper faces of the upper layer resin layer 6c and the inorganic layer 6b, respectively. The semiconductor layer 20 is formed on the upper face of the first insulating film 18, and functions as a channel of the TFT in the display region DA. The second insulating film 22 is formed on the upper faces of the first insulating film 18 and the semiconductor layer 20. The first metal layer GE is formed and patterned on the upper face of the second insulating film 22, and functions as a gate electrode of the TFT in the display region DA. The first metal layer GE is insulated from the semiconductor layer 20 by the second insulating film 22. The third insulating film 24 is formed on the upper faces of the second insulating film 22 and the first metal layer GE. The second metal layer SE is formed at positions overlapping openings formed in the second insulating film 22 and the third insulating film 24. Therefore, the second metal layer SE is electrically connected to the semiconductor layer 20 in the display region DA, and functions as a source electrode and a drain electrode of the TFT.

The first resin layer 10 is formed on the upper face of the TFT layer 8 on the entire surface including the display region DA and the frame region NA of the display device 2. The first resin layer 10 is formed being applied by an ink-jet method or the like. The first resin layer 10 functions as a flattening film, but in a case that the height of the TFT layer 8 in the lower layers varies greatly, the difference in height may be reflected to the upper layers than the first resin layer 10.

Similar to the first resin layer 10, the second resin layer 12 is formed on the upper face of the first resin layer 10 on the entire surface including the display region DA and the frame region NA of the display device 2. The second resin layer 12 may be formed by a photolithography method by using a halftone mask after the resin is applied by an ink-jet method or the like. At this time, a photo spacer PS having a film thickness greater than the thickness of the film at other positions is formed in the display region DA. In the second resin layer 12, in a case that the height of the lower layers varies greatly, the difference in height may be reflected.

The light-emitting element layer 14 has a structure in which a first electrode 26, a light-emitting layer 28, and a second electrode 30 are layered in this order. The first electrode 26 and the light-emitting layer 28 are formed in an island shape in the display region DA. The second electrode 30 is formed in common in the display region DA and the frame region NA. Each light-emitting element may be configured by the first electrode 26 in an island shape, the light-emitting layer 28, and the common second electrode 30.

The first electrode 26 is formed on the upper face of the first resin layer 10, and is electrically connected to the drain electrode of the TFT formed by the second metal layer SE of the TFT layer 8 via an opening of the first resin layer 10. The opening of the first resin layer 10 by which the first electrode 26 and the second metal layer SE connect may be formed by photolithography or the like during formation of the first resin layer 10. The first electrode 26 is formed not only in the display region DA but also in a portion of the frame region NA.

The light-emitting layer 28 is formed in an opening of the second resin layer 12 formed at a position overlapping the first electrode 26 in the display region DA. The opening may be formed during photolithography by a halftone mask of the second resin layer 12 described above. The second electrode 30 is formed on the upper faces of the second resin layer 12 and the light-emitting layer 28. Thus, the light-emitting layer 28 is electrically connected to each of the first electrode 26 and the second electrode 30. The light-emitting layer 28 emits light by the first electrode 26 and the second electrode 30 injecting each of electrons or holes into the light-emitting layer 28. The TFT in the TFT layer 8 may be formed for each light-emitting element of the light-emitting element layer 14, and the potential difference between the electrodes of the light-emitting element layer 14 may be controlled to control the light emission of the light-emitting layer 28.

The sealing layer 16 is formed on the upper face of the second electrode 30 on the entire surface including the display region DA and the frame region NA of the display device 2. The sealing layer 16 may have a function of preventing the intrusion of foreign matters, such as moisture from outside, into each of the layers below the sealing layer 16. The sealing layer 16 may have a layered structure of an inorganic layer and an organic layer.

Here, in the frame region NA, a layered structure including the underlayer 6, the first insulating film 18, the semiconductor layer 20, the second insulating film 22, the first metal layer GE, the first resin layer 10, the first electrode 26, and the second resin layer 12 is formed as a layered body ST. It is sufficient that the layered body ST be formed in a portion of the frame region NA, and, for example, as illustrated in FIG. 2, may be formed around the entire periphery of the display region DA in the frame region NA.

The maximum film thickness from the lower face of the first insulating film 18 in the display region DA to the upper face of the second resin layer 12 in the display region DA is denoted by R3. In this case, as illustrated in FIG. 1, R3 corresponds to the film thickness between the lower face 18a of the first insulating film 18 in contact with the upper layer resin layer 6c and the upper face 12a of the photo spacer PS.

Next, the maximum film thickness from the lower face of the first insulating film 18 in the frame region NA to the upper face of the second resin layer 12 in the frame region NA is denoted by R4. In this case, as illustrated in FIG. 1, R4 corresponds to the film thickness between the lower face 18a of the first insulating film 18 in contact with the inorganic layer 6b and the upper face 12b of the second resin layer 12 in the layered body ST.

Next, the maximum film thickness from the lower face of the first insulating film 18 in the frame region NA to the upper face of the second resin layer 12 in the display region DA is denoted by R5. In this case, as illustrated in FIG. 1, R5 corresponds to the film thickness between the lower face 18a of the first insulating film 18 in contact with the inorganic layer 6b and the upper face 12a of the photo spacer PS.

Next, the maximum film thicknesses from the lower faces of the underlayer 6 in the display region DA and the frame region NA to the upper faces of the second resin layer 12 in the display region DA and the frame region NA are denoted by R6 and R7, respectively. In this case, as illustrated in FIG. 1, R6 corresponds to the film thickness between the lower face 6d of the underlayer 6 and the upper face 12a of the photo spacer PS, and R7 corresponds to the film thickness between the lower face 6d of the underlayer 6 and the upper face 12b of the second resin layer 12 in the layered body ST.

At this time, as can be seen in FIG. 1, R3 is thinner than R4 and R5 is greater than R4. Furthermore, the R6 is greater than R7. The R4 is thicker than R3 because each layer above the underlayer 6 is layered without being removed or thinned in the layered body ST.

Figure 3:
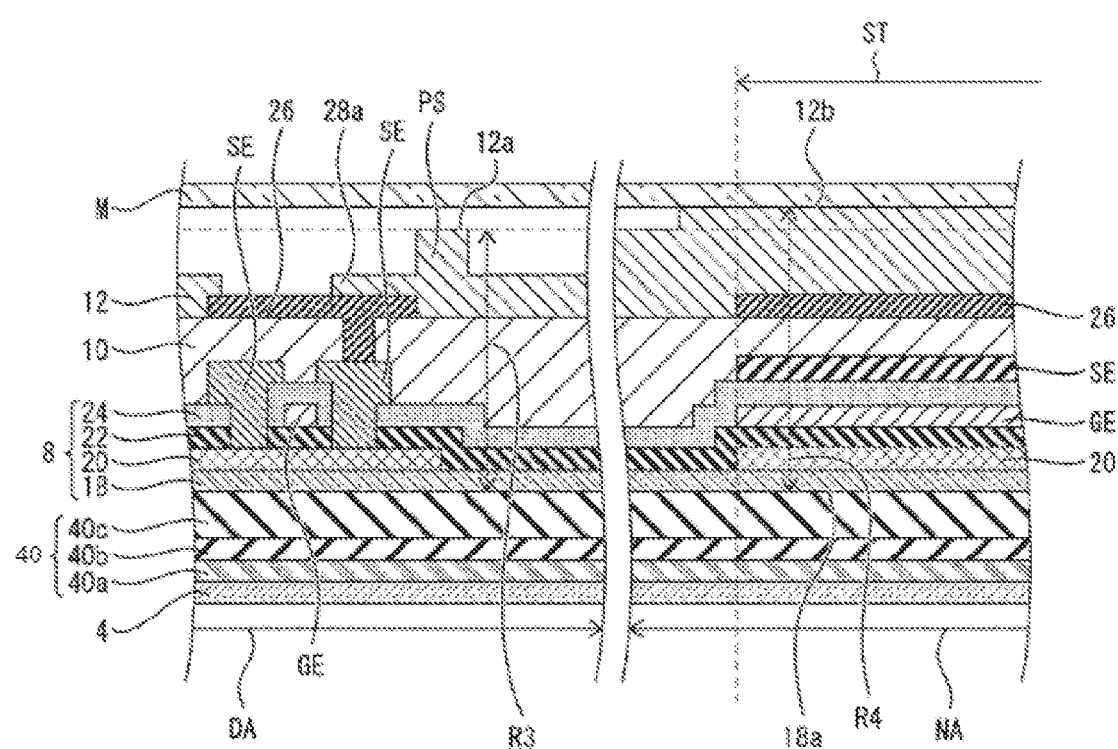
FIG. 3 is a schematic diagram of a side cross section of a display device in a vapor deposition step according to a comparative embodiment.
Figure 4:
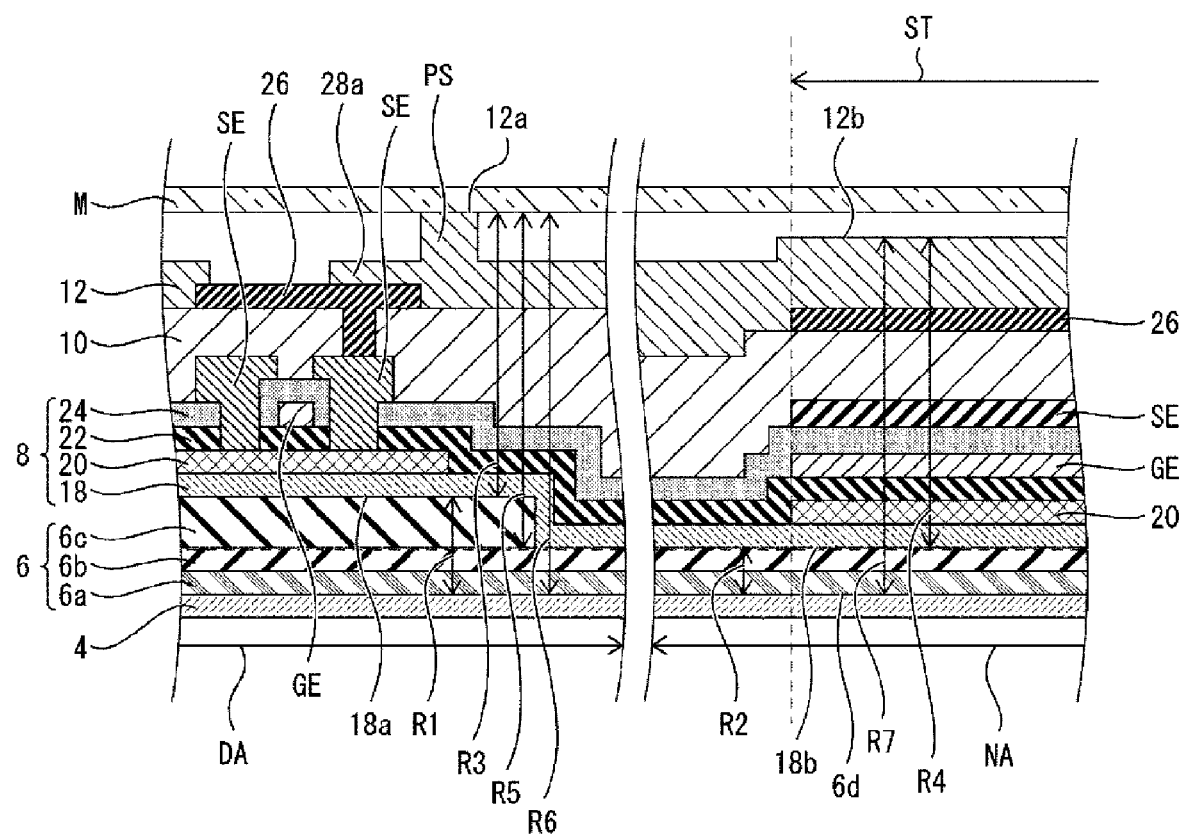
FIG. 4 is a schematic diagram of a side cross section of the display device in a vapor deposition step according to the first embodiment.

The effect of the display device 2 according to the present embodiment will be described in detail by comparing the cross-sectional views of the display devices according to each of the present embodiment and a comparative embodiment illustrating states in the middle of the vapor deposition step, which are illustrated in FIG. 3 and FIG. 4.

FIG. 3 is a schematic cross-sectional view illustrating a state in the middle of a vapor deposition step of a light-emitting layer 28 of a display device according to a comparative embodiment. The display device according to the comparative embodiment includes, instead of the underlayer 6, an underlayer 40 including an upper layer resin layer 40c that is also formed in the frame region NA. Therefore, the underlayer 40 has substantially the same film thickness throughout the entire surface of the display device according to the comparative embodiment.

The light-emitting layer 28 may be formed by the material of the light-emitting layer 28 being deposited on an opening 28a formed in the second resin layer 12 through a vapor deposition mask M. At this time, the height of the photo spacer PS is designed so that the distance between the opening 28a and the vapor deposition mask M is appropriately controlled by the vapor deposition mask M abutting the upper face 12a of the photo spacer PS.

However, as noted above, R3 is thinner than R4 and R5 is greater than R4. Thus, in a case that the upper layer resin layer 40c is formed in the frame region NA as in the display device according to the comparative embodiment illustrated in FIG. 3, the height of the upper face 12b of the second resin layer 12 in the layered body ST may exceed the upper face 12a of the photo spacer PS. Therefore, in the vapor deposition step of the light-emitting layer 28, the vapor deposition mask M abuts the upper face 12b of the second resin layer 12 in the layered body ST before the vapor deposition mask M abuts the upper face 12a of the photo spacer PS. In this state, in a case that the light-emitting layer 28 is deposited, the distance between the vapor deposition mask M and the opening 28a is not appropriate, and thus there is a possibility of defects such as deposition defects or the like.

In the display device 2 according to the present embodiment, since the upper layer resin layer 6c of the underlayer 6 is removed in the frame region NA, the underlayer 6 in the frame region NA is thinner than the underlayer 6 in the display region DA. Thus, as illustrated in FIG. 1, it is possible to design the display device 2 such that R7 is thinner than R6. In other words, it is possible to form the layered body ST such that the height of the upper face 12b of the second resin layer 12 in the layered body ST with respect to the lower face 6d of the underlayer 6 is less than the upper face 12a of the photo spacer PS.

Therefore, as illustrated in FIG. 4, in the vapor deposition step of the light-emitting layer 28, the vapor deposition mask M abuts the upper face 12a of the photo spacer PS before the vapor deposition mask M abuts the upper face 12b of the second resin layer 12 in the layered body ST. Therefore, during the vapor deposition of the light-emitting layer 28, the distance between the vapor deposition mask M and the opening 28a can be appropriately controlled.

In the display device 2 according to the present embodiment, the removal of the metal layer including the first metal layer GE having a relatively thick film thickness is not required in the frame region NA in order to thin the layered body ST. Therefore, the display device 2 can be formed leaving the metal layer in the frame region NA.

For example, the layered body ST may include a dummy pattern to equalize the etch rate across the entire surface of the display device 2 in a case of etching the metal layer in the display region DA.

For example, the layered body ST may include a residue of a short ring formed such that large static electricity does not occur in an external connection terminal during the formation of the external connection terminal of the display device 2. In this case, at least a portion of the short ring may be included in the layered body ST during the formation of the layered body ST. For example, a residue of a short ring may remain in the layered body ST, such as wiring line between the external connection terminal and the short ring after the external connection terminal and the short ring have been partitioned.

For example, the layered body ST may include a portion of wiring line of a gate driver. In particular, in the present embodiment, since the layered body ST includes the first electrode 26 that is the same layer as the gate electrode, it is possible to create wiring line of the gate driver in the layered body ST in conjunction with the formation of the layered body ST.

Figure 5:
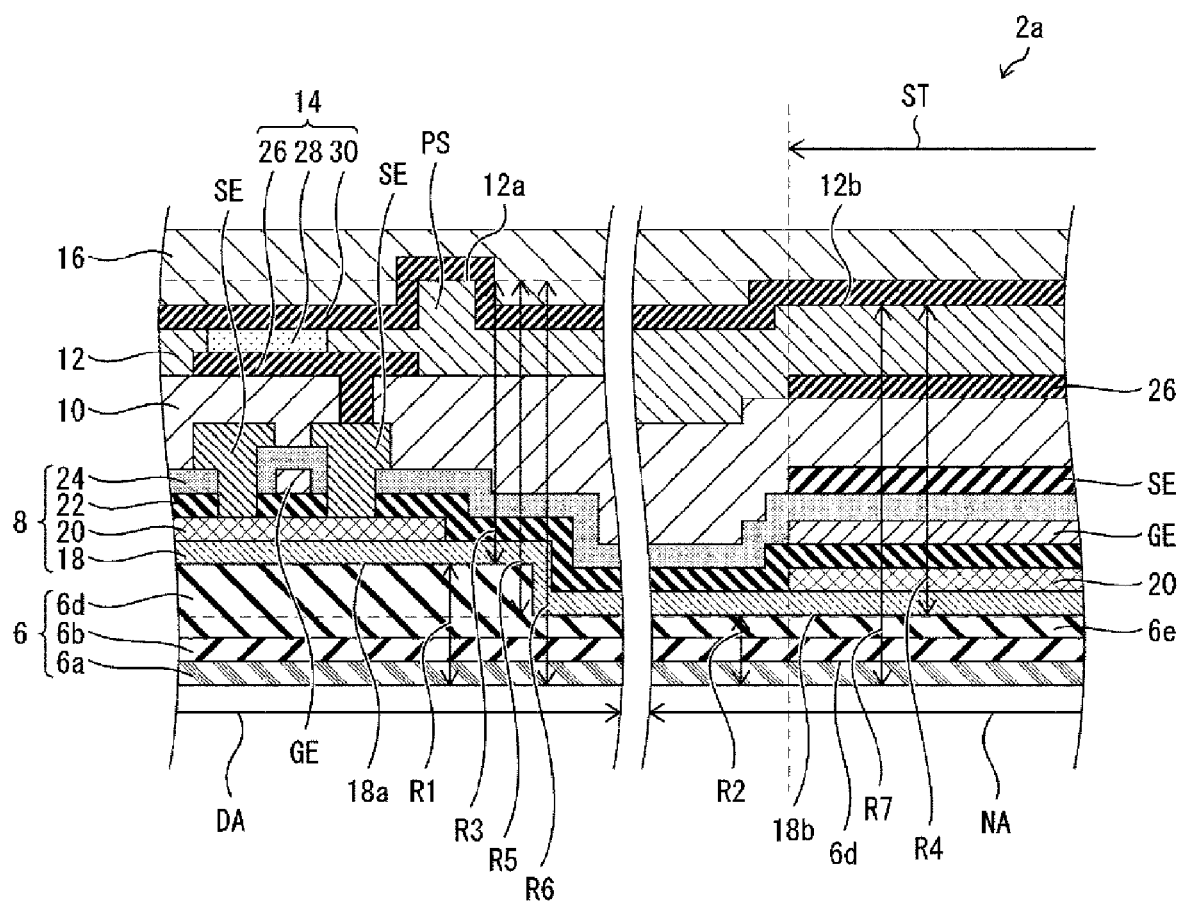
FIG. 5 is a schematic diagram of a side cross section of a display device according to a modified example of the first embodiment.

FIG. 5 is a cross-sectional side view of a display device 2a according to a modified example of the present embodiment. In the present modified example, the display device 2a has the same configuration, except that the configuration of the underlayer 6 is different and the glass substrate 4 is not provided, compared to the display device 2.

In the display device 2a, an upper layer resin layer 6e is formed also in the frame region NA. Here, the upper layer resin layer 6e is a layer having a thinner film thickness than the upper layer resin layer 6c. The upper layer resin layer 6e may be obtained by thinning the upper layer resin layer 6c in the frame region NA by photolithography by using a halftone mask.

In the display device 2a, because R1 is thicker than R2, the relationship that R7 is thicker than R6 is maintained compared to the display device 2. Thus, the display device 2a achieves the same effect as the display device 2.

The display device 2a does not include the glass substrate 4, and each layer is formed above the underlayer 6. Thus, in the present modified example, the display device 2a having flexibility can be realized by configuring each layer of the display device 2a with flexible materials. The display device 2a may be obtained by irradiating the glass substrate 4 with a laser from below and peeling the glass substrate 4 and the underlayer 6, after forming each layer on the glass substrate 4.

Furthermore, as a modified example of the present embodiment, the display device 2a may include a flexible substrate on the lower face of the underlayer 6 by attaching the flexible substrate to the lower face of the underlayer 6 after peeling the glass substrate 4 and the underlayer 6. In this case, R1, R2, R6, and R7 may be lengths from the flexible substrate.

Note that in the present embodiment, a portion of the underlayer 6 having a layered structure is thinned, but the disclosure is not limited thereto, and a portion of the underlayer 6 having one layer may be made thinner. In the present embodiment, a portion of the underlayer 6 is thinned by thinning or removal of the organic film of the underlayer 6, but the underlayer 6 may be a glass substrate, and a portion of the underlayer 6 may be thinned by thinning the glass substrate.

Second Embodiment

Figure 6:
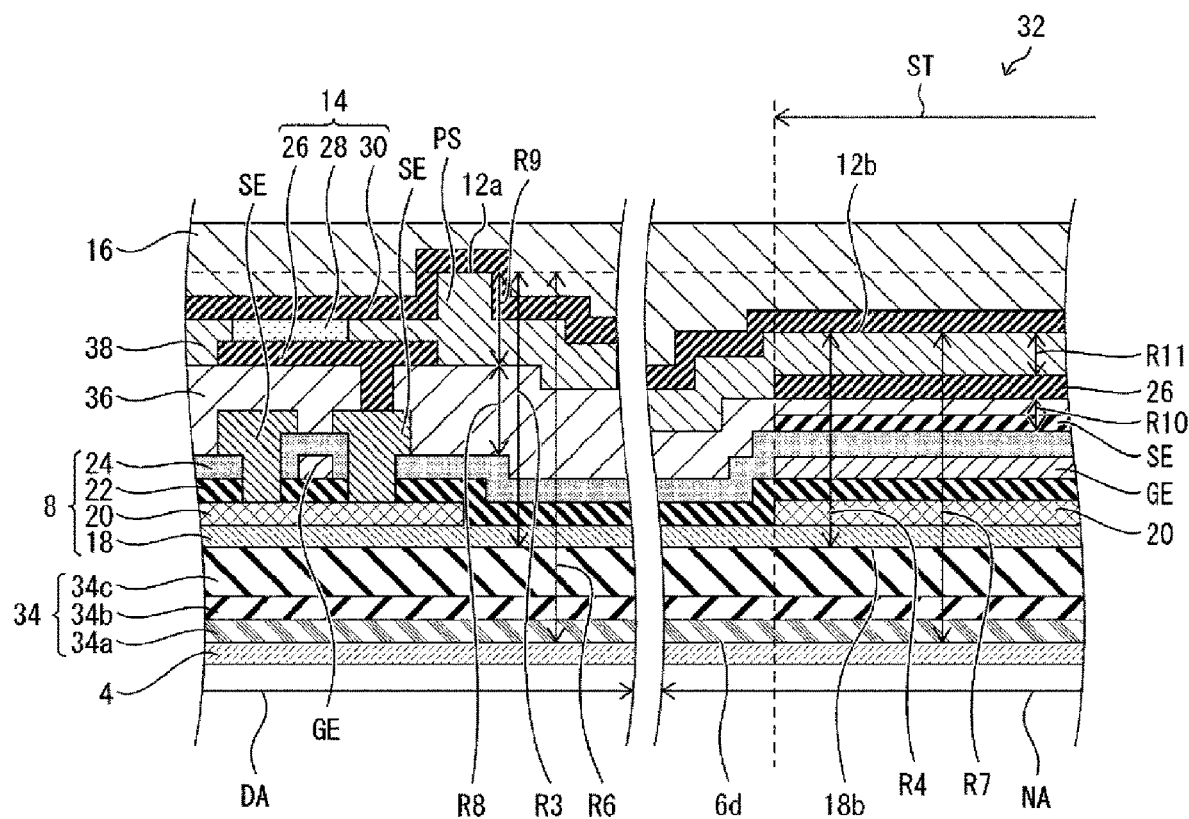
FIG. 6 is a schematic diagram of a side cross section of a display device according to a second embodiment.

FIG. 6 is a cross-sectional side view of a display device 32 according to the present embodiment. The display device 32 has the same configuration compared with the display device 2 except that the display device 32 includes an underlayer 34, a first resin layer 36, and a second resin layer 38 instead of the underlayer 6, the first resin layer 10, and the second resin layer 12, respectively.

An upper layer resin layer 34c is formed in the underlayer 34 also in the frame region NA. Therefore, the underlayer 34 has substantially the same film thickness throughout the entire surface of the display device 32.

The first resin layer 36 and the second resin layer 38 have the same configurations with respect to the first resin layer 10 and the second resin layer 12, respectively, except that the film thicknesses in the frame region NA are different.

As illustrated in FIG. 6, in each of the first resin layer 36 and the second resin layer 38, the maximum film thicknesses in the display region DA are R8 and R9, and the maximum film thicknesses in the frame region NA are R10 and R11. In this case, as illustrated in FIG. 6, R8 is greater than R10 and R9 is greater than R11. Further, the sum of R8 and R9 is greater than the sum of R10 and R11. That is, the film thicknesses of the first resin layer 36 and the second resin layer 38 is greater in the display region DA than in the frame region NA. The first resin layer 36 and the second resin layer 38 may be thin film layers that are thinned by photolithography by using a halftone mask in the frame region NA.

The R3 to R7 in FIG. 6 correspond to the film thicknesses at the same position as each of R3 to R7 in the display device 2. In this case, in the display device 32, R3 is thicker than R4 and R6 is greater than R7, as illustrated in FIG. 6. Thus, the display device 32 has the same effect as the display device 2.

Here, the first resin layer 36 of the display device 32 may use photolithography by using a halftone mask to form an opening for achieving electrical connection between the second metal layer SE and the first electrode 26 in the display region DA. The second resin layer 38 of the display device 32 may use photolithography by using a halftone mask to form an opening in which the light-emitting layer 28 is formed and the photo spacer PS in the display region DA. In this case, the thinning of the first resin layer 36 and the second resin layer 38 in the frame region NA can be performed in conjunction with the formation of the respective resin layers. Note that the aforementioned thinning may be performed in at least one of the first resin layer 36 and the second resin layer 38.

Figure 7:
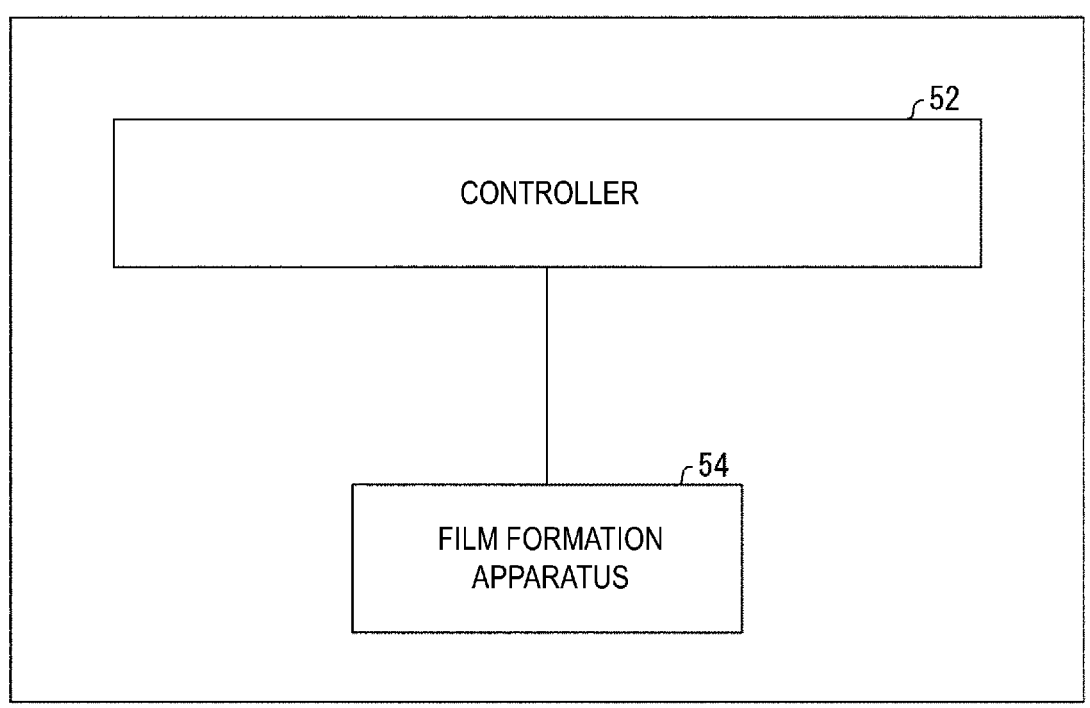
FIG. 7 is a block diagram illustrating a manufacturing apparatus of the display device according to each of the embodiments.

FIG. 7 is a block diagram illustrating a manufacturing apparatus 50 of the display device according to each of the embodiments described above. The manufacturing apparatus 50 of the light-emitting device includes a controller 52 and a film formation apparatus 54. The controller 52 controls the film formation apparatus 54. The film formation apparatus 54 performs film formation of each layer of the display device according to each of the embodiments described above.

Supplement

A display device according to Aspect 1 includes: an underlayer, a first insulating film contacting an upper face of the underlayer, a semiconductor layer, a second insulating film, a first metal layer, a first resin layer, a first electrode, and a second resin layer, in order from a lower layer, wherein at least one of the underlayer, the first resin layer, and the second resin layer is a thin film layer having a maximum film thickness in a display region provided with a light-emitting element being thicker than a maximum film thickness in a frame region surrounding the display region.

According to Aspect 2, the thin film layer includes the underlayer.

According to Aspect 3, a maximum film thickness from a lower face of the first insulating film in the display region to an upper face of the second resin layer in the display region is thinner than a maximum film thickness from a lower face of the first insulating film in the frame region to an upper face of the second resin layer in the frame region, and a maximum film thickness from the lower face of the first insulating film in the frame region to the upper face of the second resin layer in the display region is thicker than a maximum film thickness from the lower face of the first insulating film in the frame region to the upper face of the second resin layer in the frame region.

According to Aspect 4, the underlayer includes a lower layer resin layer, an inorganic layer, and an upper layer resin layer, in order from a lower layer.

According to Aspect 5, a film thickness of the upper layer resin layer in the frame region is less than a film thickness of the upper layer resin layer in the display region, or the underlayer includes the upper layer resin layer only in the display region.

According to Aspect 6, the thin film layer is at least one of the first resin layer and the second resin layer.

According to Aspect 7, a sum of maximum film thicknesses of the first resin layer and the second resin layer in the display region is thicker than a sum of maximum film thicknesses of each of the first resin layer and the second resin layer in the frame region.

According to Aspect 8, each of a maximum film thickness of the first resin layer and a maximum film thickness of the second resin layer in the display region is thicker than each of a maximum film thickness of the first resin layer and a maximum film thickness of the second resin layer in the frame region, and a maximum film thickness from a lower face of the first resin layer in the display region to the upper face of the second resin layer in the display region is thicker than the maximum film thickness from the lower face of the first insulating film in the frame region to the upper face of the second resin layer in the frame region.

According to Aspect 9, a maximum film thickness from a lower face of the underlayer in the display region to the upper face of the second resin layer in the display region is thicker than a maximum film thickness from a lower face of the underlayer in the frame region to the upper face of the second resin layer in the frame region.

According to Aspect 10, the display device further includes a layered body including the underlayer, the first insulating film, the semiconductor layer, the second insulating film, the first metal layer, the first resin layer, the first electrode, and the second resin layer, in the frame region.

According to Aspect 11, the layered body includes at least one of a dummy pattern, a residue of a short ring, and wiring line of a gate driver.

A method for manufacturing a display device according to Aspect 12 includes the step of: film-forming each layer of a display device including an underlayer, a first insulating film contacting an upper face of the underlayer, a semiconductor layer, a second insulating film, a first metal layer, a first resin layer, a first electrode, and a second resin layer, in order from a lower layer, wherein in the step of film-forming, a formation of at least one of the underlayer, the first resin layer, and the second resin layer includes a step of thinning to make a maximum film thickness in a display region provided with a light-emitting element being thicker than a maximum film thickness in a frame region surrounding the display region.

According to Aspect 13, photolithography is performed by using a halftone mask in the step of thinning.

According to Aspect 14, the light-emitting element includes a light-emitting layer, and the method further includes a step of forming the light-emitting layer by vapor deposition by using a vapor deposition mask.

A manufacturing apparatus of a display device according to Aspect 15 is configured to: form each layer of a display device including an underlayer, a first insulating film contacting an upper face of the underlayer, a semiconductor layer, a second insulating film, a first metal layer, a first resin layer, a first electrode, and a second resin layer, in order from a lower layer; and include a film formation apparatus that, in a formation of at least one of the underlayer, the first resin layer, and the second resin layer, make a maximum film thickness in a display region provided with a light-emitting element being thicker than a maximum film thickness in a frame region surrounding the display region.

The disclosure is not limited to each of the embodiments described above, and various modifications may be made within the scope of the claims. Embodiments obtained by appropriately combining technical approaches disclosed in each of the different embodiments also fall within the technical scope of the disclosure. Moreover, novel technical features can be formed by combining the technical approaches disclosed in the embodiments.

The invention claimed is:

1. A display device comprising:
an underlayer, a first insulating film contacting an upper face of the underlayer, a semiconductor layer, a second insulating film, a first metal layer, a first resin layer, a first electrode, and a second resin layer, which are formed in order from bottom to top,
wherein any one of the underlayer, the first resin layer, and the second resin layer is a thin film layer having a first maximum film thickness in a display region that is thicker than a second maximum film thickness of a corresponding one of the underlayer, the first resin layer, and the second resin layer in a frame region, and the frame region surrounds the display region, and
wherein the underlayer includes a resin layer, and the display region is provided with a light-emitting element.

2. The display device according to claim 1,
wherein a maximum film thickness from a lower face of the first insulating film in the display region to an upper face of the second resin layer in the display region is thinner than a maximum film thickness from a lower face of the first insulating film in the frame region to an upper face of the second resin layer in the frame region, and a maximum film thickness from the lower face of the first insulating film in the frame region to the upper face of the second resin layer in the display region is thicker than a maximum film thickness from the lower face of the first insulating film in the frame region to the upper face of the second resin layer in the frame region.

3. The display device according to claim 2,
wherein the underlayer includes a lower layer resin layer, an inorganic layer, and an upper layer resin layer, which are formed in border from bottom to top.

4. The display device according to claim 3,
wherein a film thickness of the upper layer resin layer in the frame region is less than a film thickness of the upper layer resin layer in the display region, or the underlayer includes the upper layer resin layer only in the display region.

5. The display device according to claim 2,
wherein a sum of the first maximum film thicknesses of the first resin layer and the second resin layer in the display region is thicker than a sum of the second maximum film thicknesses of each of the first resin layer and the second resin layer in the frame region.

6. The display device according to claim 2,
wherein each of the first maximum film thickness of the first resin layer and Hall the first maximum film thickness of the second resin layer in the display region is thicker than each of the second maximum film thickness of the first resin layer and the second maximum film thickness of the second resin layer in the frame region, and a maximum film thickness from a lower face of the first resin layer in the display region to an upper face of the second resin layer in the display region is thicker than a maximum film thickness from a lower face of the first insulating film in the frame region to an upper face of the second resin layer in the frame region.

7. The display device according to claim 2,
wherein a maximum film thickness from a lower face of the underlayer in the display region to an upper face of the second resin layer in the display region is thicker than a maximum film thickness from a lower face of the underlayer in the frame region to an upper face of the second resin layer in the frame region.

8. The display device according to claim 2, further comprising:
a layered body including the underlayer, the first insulating film, the semiconductor layer, the second insulating film, the first metal layer, the first resin layer, the first electrode, and the second resin layer, in the frame region.

9. A method for manufacturing a display device according to claim 1, the method comprising:
film-forming each layer of the display device including the underlayer, the first insulating film contacting the upper face of the underlayer, the semiconductor layer, the second insulating film, the first metal layer, the first resin layer, the first electrode, and the second resin layer, in said order from bottom to top;
thinning the at least one of the underlayer, the first resin layer, and the second resin layer to make the first maximum film thickness of the at least one of the underlayer, the first resin layer, and the second resin layer in the display region thicker than flail the second maximum film thickness of a corresponding one of the underlayer, the first resin layer, and the second resin layer in the frame region the frame region surrounding the display region; and
providing the light-emitting element to the display region.

10. The method for manufacturing the display device according to claim 9,
wherein the at least one of the underlayer, the first resin layer, and the second resin layer is thinned by photolithography by using a halftone mask.

11. The method for manufacturing the display device according to claim 9,
wherein providing the light-emitting element to the display region comprises:
providing the light-emitting element comprising a light-emitting layer by forming the light-emitting layer by vapor deposition while masking the display region with a vapor deposition mask.

12. A manufacturing apparatus of a display device according to claim 2, the manufacturing apparatus:
forming each layer of the display device including the underlayer, the first insulating film contacting the upper face of the underlayer, the semiconductor layer, the second insulating film, the first metal layer, the first resin layer, the first electrode, and the second resin layer, in order from bottom to top;
the manufacturing apparatus including a film formation apparatus that, after the underlayer, the first resin layer, and the second resin layer are formed, thins at least one of the underlayer, the first resin layer, and the second resin layer in the frame region to a second maximum thickness to be thinner than a first maximum film thickness of a corresponding one of the underlayer, the first resin layer, and the second resin layer in the display region, the frame region surrounding the display region; and
the manufacturing apparatus providing the light-emitting element in the display region.

13. A display device, comprising:
an underlayer, a first insulating film contacting an upper face of the underlayer, a semiconductor layer, a second insulating film, a first metal layer, a first resin layer, a first electrode, and a second resin layer, which are in order from bottom to top,
wherein at least one of the underlayer, the first resin layer, and the second resin layer is a thin film layer having a first maximum film thickness in a display region being thicker than a second maximum film thickness of a corresponding one of the underlayer, the first resin layer, and the second resin layer in a frame region, and the frame region surrounds the display region, and
wherein the underlayer includes a resin layer, and the display region is provided with a light-emitting element; and
the display device further comprises:
a layered body including the underlayer, the first insulating film, the semiconductor layer, the second insulating film, the first metal layer, the first resin layer, the first electrode, and the second resin layer, in the frame region,
wherein the layered body includes at least one of a dummy pattern, a residue of a short ring, and a wiring line of a gate driver.

* * * * *